United States Patent
Oh et al.

(10) Patent No.: US 8,101,475 B2
(45) Date of Patent: Jan. 24, 2012

(54) FIELD EFFECT TRANSISTOR AND METHOD FOR MANUFACTURING THE SAME

(75) Inventors: Chang-Woo Oh, Suwon-si (KR); Dong-Gun Park, Seongnam-si (KR); Dong-Won Kim, Seongnam-si (KR); Dong-Uk Choi, Hwaseong-si (KR); Kyoung-Hwan Yeo, Seoul (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 102 days.

(21) Appl. No.: 12/588,193

(22) Filed: Oct. 7, 2009

(65) Prior Publication Data
US 2010/0035398 A1 Feb. 11, 2010

Related U.S. Application Data

(62) Division of application No. 11/089,371, filed on Mar. 25, 2005, now abandoned.

(30) Foreign Application Priority Data

Jun. 16, 2004 (KR) .................... 2004-44512

(51) Int. Cl.
*H01L 21/00* (2006.01)
(52) U.S. Cl. ............... 438/197; 438/290; 257/288
(58) Field of Classification Search .......... 438/197, 438/290; 257/288
See application file for complete search history.

(56) References Cited

U.S. PATENT DOCUMENTS

| | | | | |
|---|---|---|---|---|
| 4,753,897 A | | 6/1988 | Lund et al. | 438/296 |
| 4,806,998 A | * | 2/1989 | Vinter et al. | 257/192 |
| 4,905,061 A | * | 2/1990 | Ohmuro et al. | 257/280 |
| 5,045,916 A | | 9/1991 | Vor et al. | 257/383 |
| 5,514,891 A | * | 5/1996 | Abrokwah et al. | 257/346 |
| 5,550,071 A | * | 8/1996 | Ryou | 438/305 |
| 6,049,119 A | | 4/2000 | Smith | 257/575 |
| 6,114,733 A | * | 9/2000 | Hong | 257/384 |
| 6,169,006 B1 | * | 1/2001 | Gardner et al. | 438/303 |
| 6,413,802 B1 | | 7/2002 | Hu et al. | |
| 6,486,014 B1 | * | 11/2002 | Miyanaga et al. | 438/217 |
| 6,518,155 B1 | | 2/2003 | Chau et al. | 438/592 |
| 6,528,851 B1 | | 3/2003 | Yu | 257/347 |
| 6,544,854 B1 | * | 4/2003 | Puchner et al. | 438/308 |

(Continued)

OTHER PUBLICATIONS

Korean Office Action dated Feb. 28, 2006 w/English translation.

*Primary Examiner* — Jarrett Stark
*Assistant Examiner* — Nicholas Tobergte
(74) *Attorney, Agent, or Firm* — Muir Patent Consulting, PLLC

(57) ABSTRACT

A field effect transistor (FET) and a method for manufacturing the same, in which the FET may include an isolation film formed on a semiconductor substrate to define an active region, and a gate electrode formed on a given portion of the semiconductor substrate. A channel layer may be formed on a portion of the gate electrode, with source and drain regions formed on either side of the channel layer so that boundaries between the channel layer and the source and drain regions of the FET may be perpendicular to a surface of the semiconductor substrate.

15 Claims, 18 Drawing Sheets

U.S. PATENT DOCUMENTS

| | | | |
|---|---|---|---|
| 6,569,742 B1 * | 5/2003 | Taniguchi et al. | 438/303 |
| 6,621,123 B1 | 9/2003 | Nakabayashi et al. | |
| 6,812,111 B2 * | 11/2004 | Cheong et al. | 438/396 |
| 6,844,227 B2 * | 1/2005 | Kubo et al. | 438/216 |
| 6,852,559 B2 * | 2/2005 | Kwak et al. | 438/44 |
| 6,960,781 B2 | 11/2005 | Currie et al. | 257/19 |
| 7,223,679 B2 | 5/2007 | Murthy et al. | 438/592 |
| 2003/0038305 A1 | 2/2003 | Wasshuber | 257/213 |

* cited by examiner

FIELD EFFECT TRANSISTOR AND METHOD FOR MANUFACTURING THE SAME

CROSS-REFERENCE TO RELATED APPLICATIONS

This application is a Divisional of U.S. application Ser. No. 11/089,371, filed on Mar. 25, 2005 now abandoned, which claims the priority of Korean Patent Application No. 2004-44512, filed on Jun. 16, 2004, in the Korean Intellectual Property Office, the disclosure each of which is incorporated herein in its entirety by reference.

BACKGROUND OF THE INVENTION

1. Field of the Invention

The present invention relates, in general, to a field effect transistor (FET) and method for manufacturing the same.

2. Description of the Related Art

As semiconductor devices become increasingly integrated, size (i.e., channel length) of MOS transistors has become scaled. As channel length is shortened, an integration density of the semiconductor device may be improved. However, decreasing channel length may cause a short channel effect to occur, such as a drain induced barrier lowering (DIBL), a hot carrier effect and/or a punch through. In order to reduce the possibility of such a short channel effect from occurring, it may be desirable to reduce a depth of a junction region and a thickness of a gate oxide layer in proportion to a decrease or shortening of the transistor channel length.

If the depth of the junction region is reduced, a junction resistance (RS, RD) is also reduced. In case of a relatively long channel transistor, the junction resistance does not have a substantial influence on an 'on current' of the transistor. However, for a short channel transistor, the junction resistance has a substantial influence and a relatively large junction resistance may greatly reduce the transistor on current. Thus, it may be desirable to improve the junction resistance characteristics of a transistor such as a MOS transistor.

The junction resistance is a function of a spreading resistance occurring at a channel edge (edge of a junction region). That is, if the spreading resistance is reduced, the junction resistance can be reduced. The spreading resistance is associated with a doping profile of a junction region. If the doping profile of the junction region can be reduced abruptly at the channel edge, referred to as 'junction abruptness', the spreading resistance may be reduced. Thus, the more definite the junction abruptness at a boundary between a channel edge and an adjacent layer (such as a source or drain region in the transistor), the lower the spreading resistance and hence, junction resistance.

However, conventionally in MOS transistors, the junction region is formed by an impurity ion implantation and annealing process. The doping profile at the junction region thus has an undesirable slope of at least about 3 nm/decade at the side portion of the junction region. This undesirable slope formed at sides of the junction region due to the ion implantation and the annealing process represents a substantial limitation in the efforts to reduce the spreading resistance, since desirable junction abruptness at the channel edge cannot be obtained.

SUMMARY OF THE INVENTION

An exemplary embodiment of the present invention is directed to field effect transistor (FET). The FET may include a semiconductor substrate having an isolation film formed thereon to define an active region, a gate electrode formed on a given portion of the semiconductor substrate, and a channel layer formed on a portion of the gate electrode. Source and drain regions maybe formed on either side of the channel layer so that boundaries between the channel layer and the source and drain regions are perpendicular to a surface of the semiconductor substrate.

Another exemplary embodiment of the present invention is directed to a FET which may include a semiconductor substrate having an isolation film formed thereon to define an active region, a channel layer formed on a portion of the active region and having a width and a length, and a gate electrode formed on the channel layer so as to extend in the width direction of the channel layer. The FET may include source and drain regions disposed on corresponding sides of the channel layer in a length direction of the channel layer so that boundaries between the channel layer and the source and drain regions are perpendicular to a surface of the semiconductor substrate. The FET may include a pair of insulating spacers, one insulating spacer formed on each sidewall of the gate electrode.

Another exemplary embodiment of the present invention is directed to a method for manufacturing a field effect transistor, in which a junction layer may be formed on a semiconductor substrate and an isolation film may be formed on a given portion of the substrate. Source and drain regions with a space between the source and drain regions may be formed in the junction layer. A channel layer may be formed in the space and a gate electrode may be formed on the channel layer.

Another exemplary embodiment of the present invention is directed to a method for manufacturing a field effect transistor, in which a channel layer may be formed on a semiconductor substrate and a gate electrode formed on the channel layer. A spacer may be formed on each corresponding sidewall of the gate electrode, and regions reserved for a source region and a drain region may be defined in the channel layer. An impurity-containing epitaxial layer may be formed in the defined regions to form the source and drain regions.

BRIEF DESCRIPTION OF THE DRAWINGS

The present invention will become more apparent by describing, in detail, exemplary embodiments thereof with reference to the attached drawings, wherein like elements are represented by like reference numerals, which are given by way of illustration only and thus do not limit the exemplary embodiments of the present invention.

DETAILED DESCRIPTION OF THE EXEMPLARY EMBODIMENTS

Figure 1:
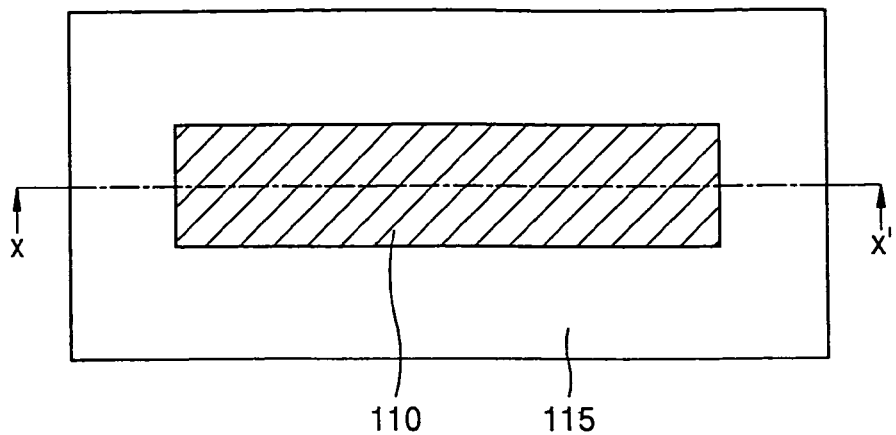
FIGS. 1 through 7 are plan views of a transistor according to an exemplary embodiment of the present invention.

The present invention will now be described more fully with reference to the accompanying drawings, in which exemplary embodiments of the invention are shown. The invention may, however, be embodied in many different forms and should not be construed as being limited to the exemplary embodiments set forth herein; rather, these exemplary embodiments are provided so that this disclosure will be thorough and complete, and will fully convey the concept of the invention to those skilled in the art. In the drawings, the thickness of layers and regions are exaggerated for clarity. Like reference numerals in the drawings denote like elements, and thus their description will be omitted. It will be understood that when an element such as a layer, region or substrate is referred to as being "on" or "onto" another element, it may be directly on the other element or intervening elements may also be present there between. As used herein, the term perpendicular may be understood as meaning perpendicular or substantially perpendicular; a boundary hereafter may be referred to hereafter as being perpendicular to a substrate surface, which means perpendicular or substantially perpendicular to the surface.

As will be described in more detail hereinafter, in order to improve a junction abruptness, a channel layer or a junction region may be defined by anisotrophic etching. Also, junction regions formed on both sides of the channel region or a channel region between junction regions may be grown by an epitaxial method. Accordingly, boundaries between the channel layer and the junction regions may be formed so as to be perpendicular to a substrate surface. Thus, a doping profile of the junction region at this boundary may have a definite abruptness. Accordingly, spreading resistance and hence junction resistance can be reduced.

FIGS. 1 through 7 are plan views of a transistor according to an exemplary embodiment of the present invention, and FIGS. 8 through 15 are sectional views of the transistor shown in FIGS. 1-7. For reference, FIGS. 8, 9A, 10, 11A, 12, 13, 14 and 15A are sectional views taken along the lines x-x' of FIGS. 1 through 7. FIGS. 9B, 11B, 13B and 15B are sectional views taken along the lines y-y' of FIGS. 1 through 7.

Figure 8:
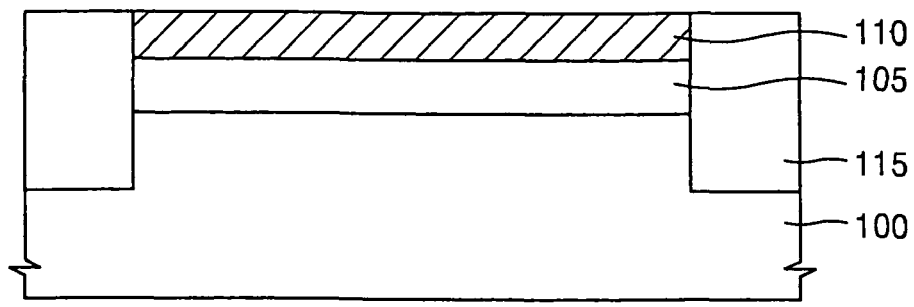
FIGS. 8 through 15 are sectional views of a transistor according to an exemplary embodiment of the present invention.

Referring to FIGS. 1 and 8, a junction layer 105 including impurities may be formed on a semiconductor substrate 100. The junction layer 105 can be formed by implanting impurities on an overall surface of the semiconductor substrate 100, performing an annealing process thereon and activating the impurities. Alternatively, the junction layer 105 may be a silicon layer including doped impurities that can be formed by a deposition process or by a Selective Epitaxial Growth (SEG) process.

In general, epitaxy is a process by which a thin layer of a single-crystal material may be deposited on a single-crystal substrate. Epitaxial growth occurs in such a way that the crystallographic structure of the substrate is reproduced in the growing material; also crystalline defects of the substrate may be reproduced in the growing material. Selective epitaxy is epitaxial growth on the substrate which is only partially a single-crystal material, For example, in the case of single crystal silicon (Si) partially covered with oxide, Si will grow epitaxially only (selectively) on the surface of a single-crystal Si. A process of selective epitaxial growth to grow a layer is known as a SEG process.

The type of impurities implanted or doped in the junction layer 105 may be different than the impurities of the substrate 100. For example, the junction layer 105 may have a concentration of impurities for a source and a drain and may be of a substantially shallow depth (thickness) suitable for a short channel transistor. A mask pattern 110, for example a silicon nitride pattern, may be formed on the junction layer 105 so as to define an isolation film 115. A trench may then be formed by etching the exposed semiconductor substrate 100 to a desired, given depth using the mask pattern 110 as a mask. An isolation film 115 is thus formed by filling the trench with an insulating material. Although the isolation film 115 may be formed after the formation of the junction layer 105, the junction layer 105 can be formed after the isolation film 115 is first formed and then the mask pattern 110 is removed.

Figure 2:
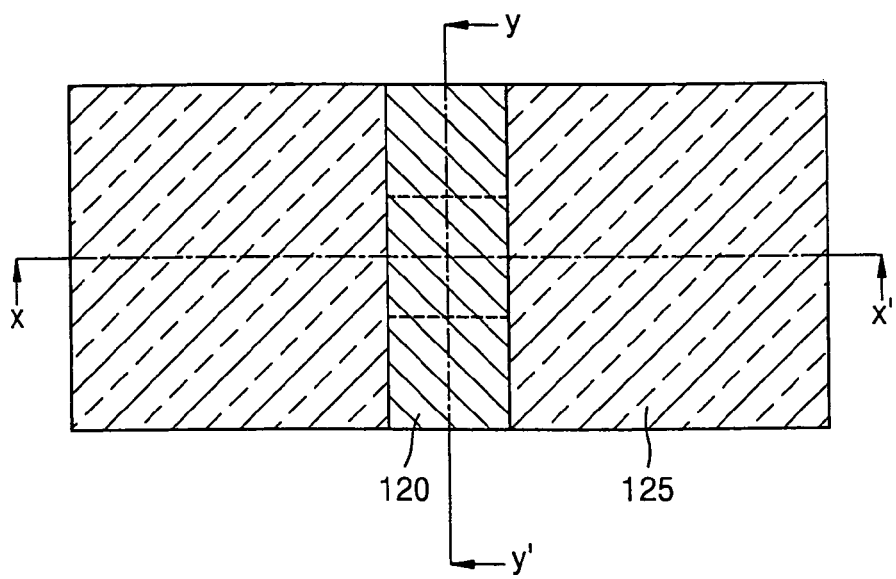
Figure 9A:
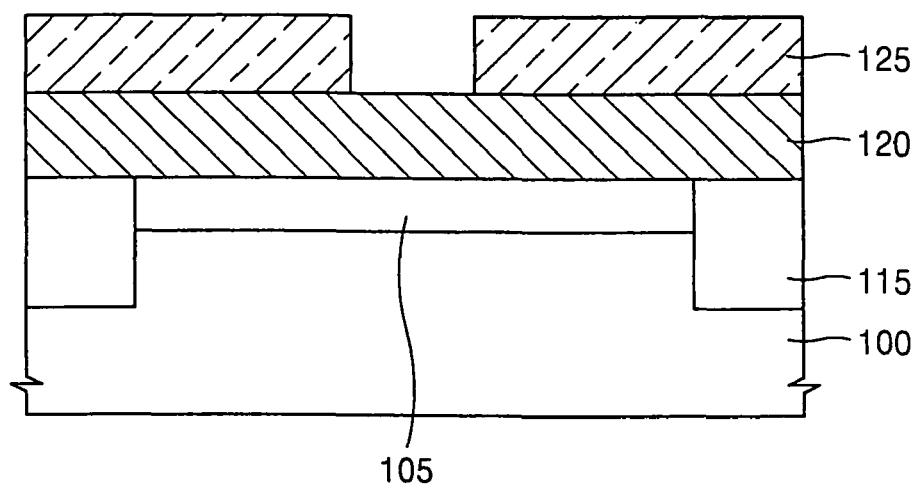
Figure 9B:
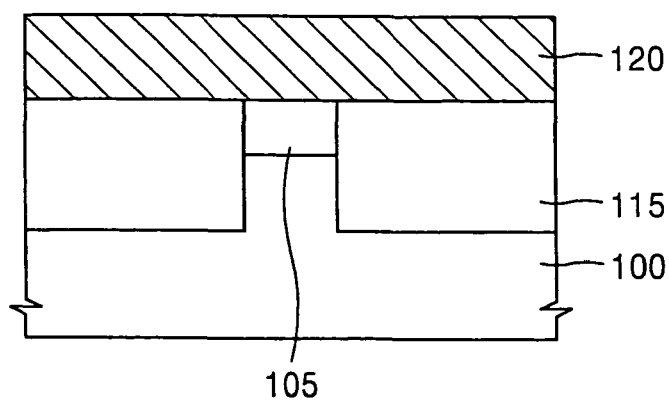

Referring to FIGS. 2, 9A and 9B, the mask pattern 110 may be removed by a known method. Then, a hard mask layer 120 may be deposited on the resulting structure. The hard mask layer 120 may be a silicon nitride layer and may be provided for anti-reflection during a photolithography process to be applied to hard mask layer 120. A photoresist pattern 125 may be formed on the hard mask layer 120 so as to expose a region for a gate electrode. A dotted line of FIG. 2 represents a boundary between the isolation film and the active region.

Figure 3:
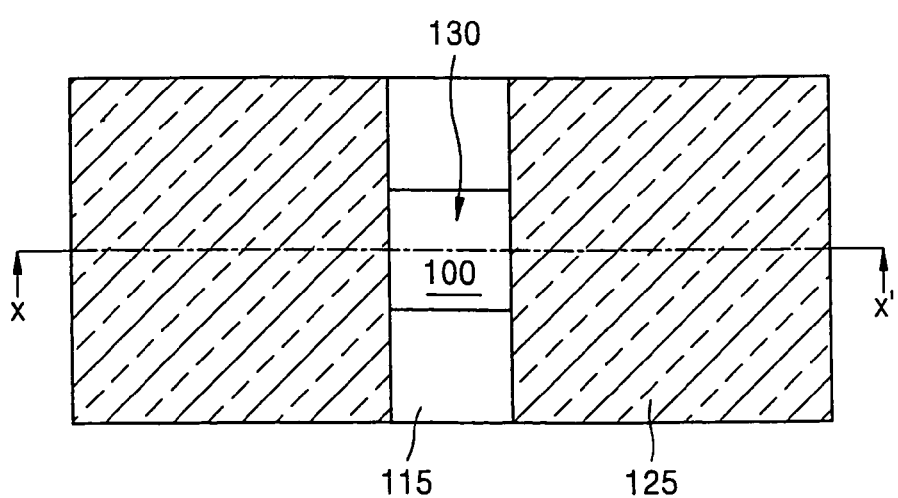
Figure 10:
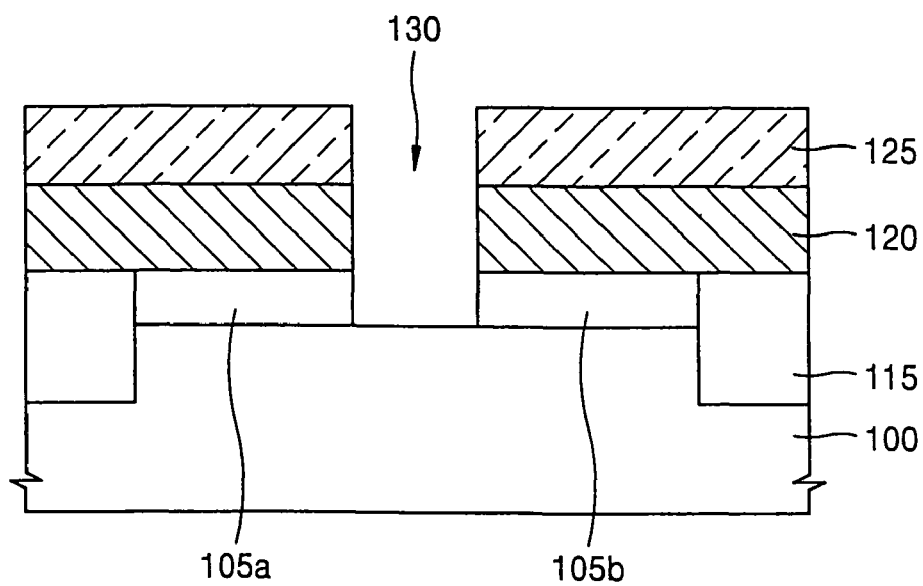

Referring to FIGS. 3 and 10, the semiconductor substrate 100 and the isolation film 115, which are disposed below the junction layer 105, may be exposed by performing an anisotrophic etching on the hard mask layer 120 and the junction layer 105 in a shape of the photoresist pattern 125 that is formed on the hard mask layer 120. A groove or gap 130 may be formed within the junction layer 105 by the anisotrophic etching, so as to define source region 105a and drain region 105b. Since the source and drain regions 105a and 105b are defined by the anisotrophic etching, their sidewalls may be formed so as to be perpendicular to the substrate 100 surface.

Figure 4:
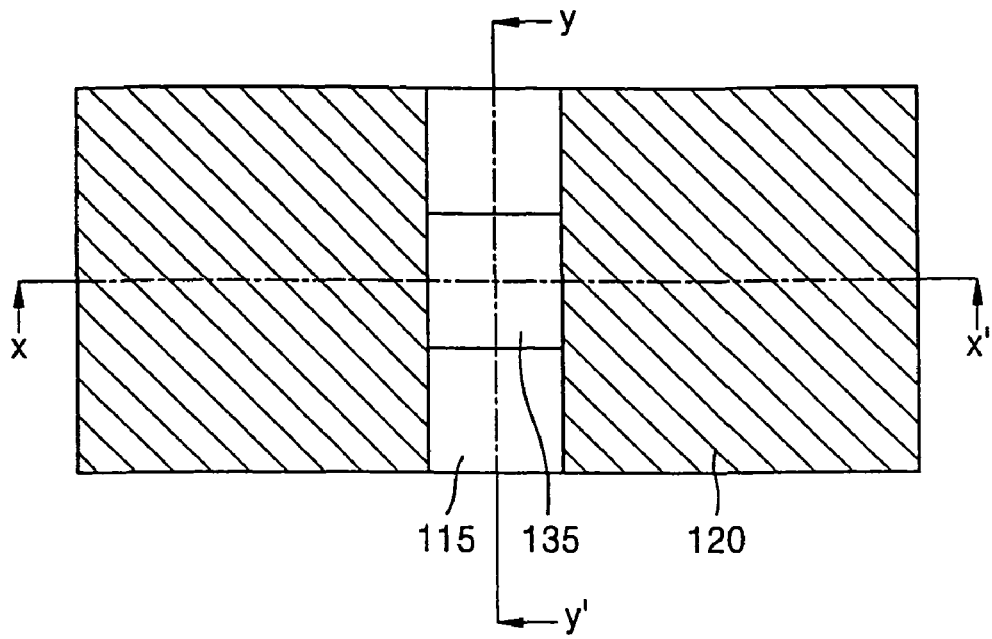
Figure 11A:
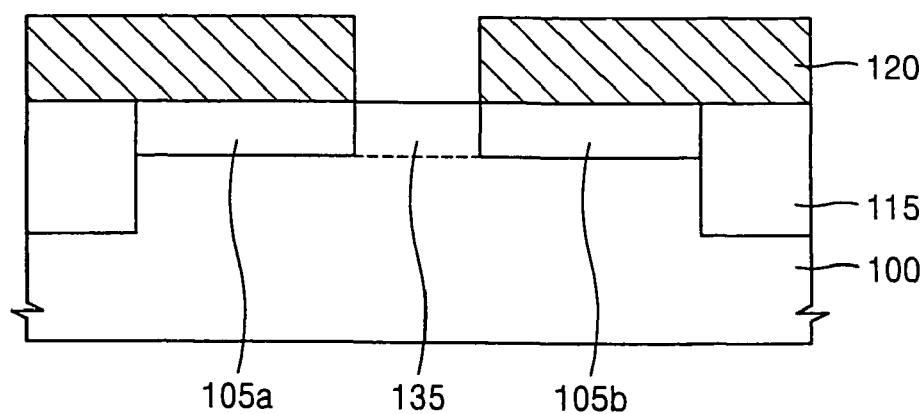
Figure 11B:
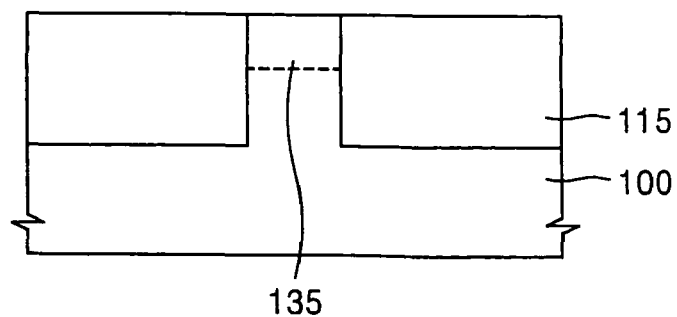

Referring to FIGS. 4, 11A and 11B, the photoresist pattern 120 may be removed by a known method. A channel layer 135 may then be formed by epitaxially growing the exposed semiconductor substrate 100 in the gap 130 in accordance with a SEG process, for example. The channel layer 135 may be a non-doped epitaxial layer (intrinsic epitaxial layer) and/or a doped epitaxial layer (extrinsic epitaxial layer) including no doped impurity or a doped impurity. Additionally, in case where impurities are doped into the channel layer 135, the doped impurities may be n type or p type. After the formation of the channel layer 135, a chemical mechanical polishing (CMP) or an etch back process may be performed on the surface of the semiconductor substrate 100 so as to planarize the surface of the semiconductor substrate 100. Of course the source region 105a and drain region 105b may also be formed of an epitaxial layer having a doped impurity, for example.

Figure 12:
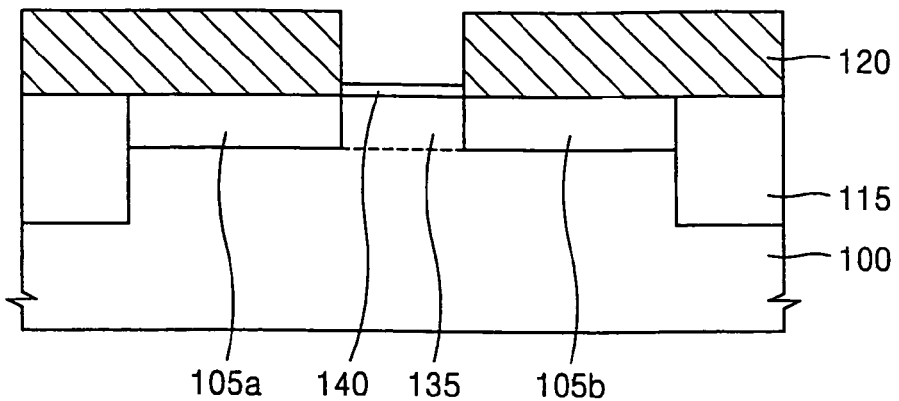

Referring to FIG. 12, a gate oxide layer 140 may be formed by oxidizing the surface of the exposed channel layer 135. The gate oxide layer 140 may be formed as part of a process of forming the gate electrode of the FET.

Figure 5:
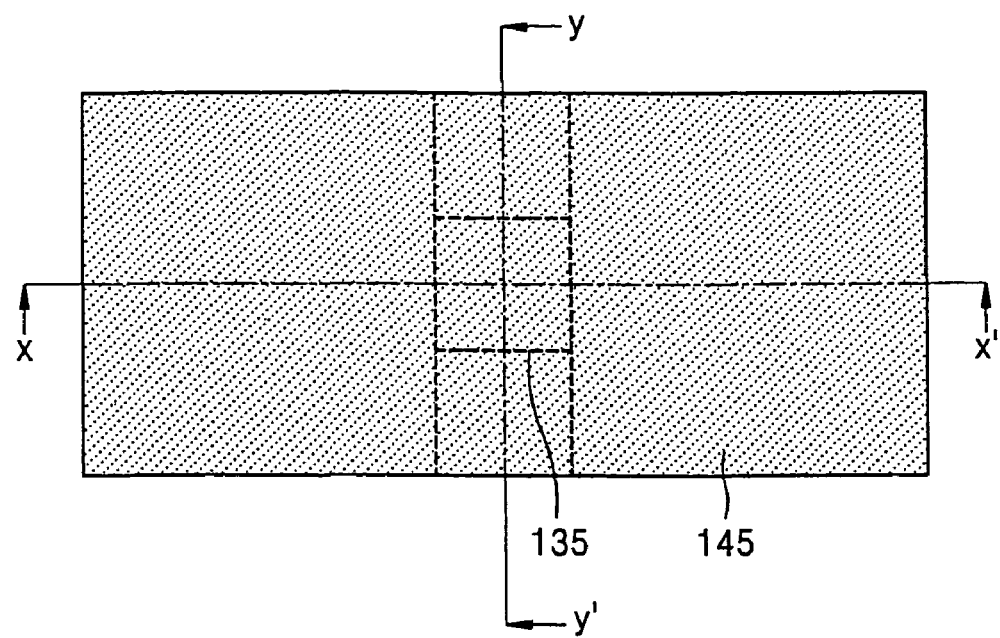
Figure 13A:
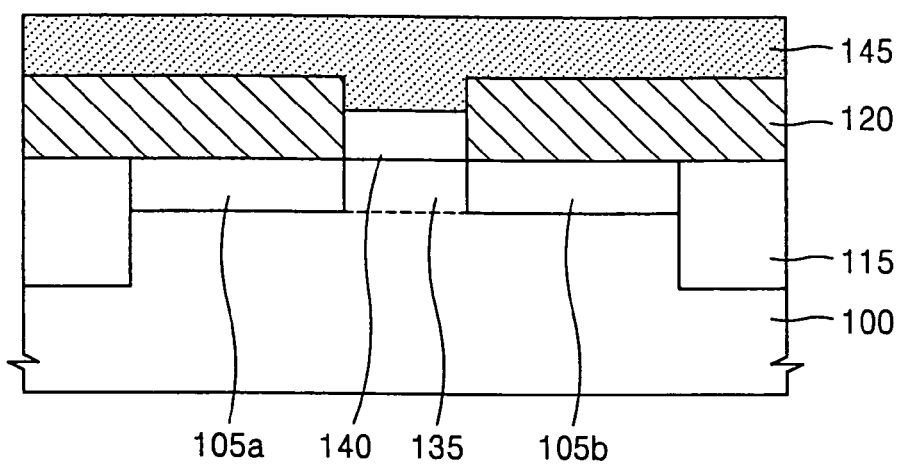
Figure 13B:
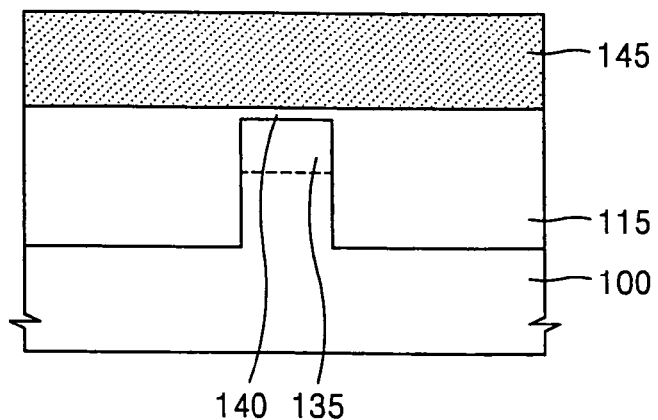

Referring to FIGS. 5, 13A and 13B, a conductive layer 145 for the gate electrode may be deposited so as to sufficiently fill a gap between the hard mask layers 120. The conductive layer 145 for the gate electrode may be a doped poly silicon layer, for example.

Figure 6:
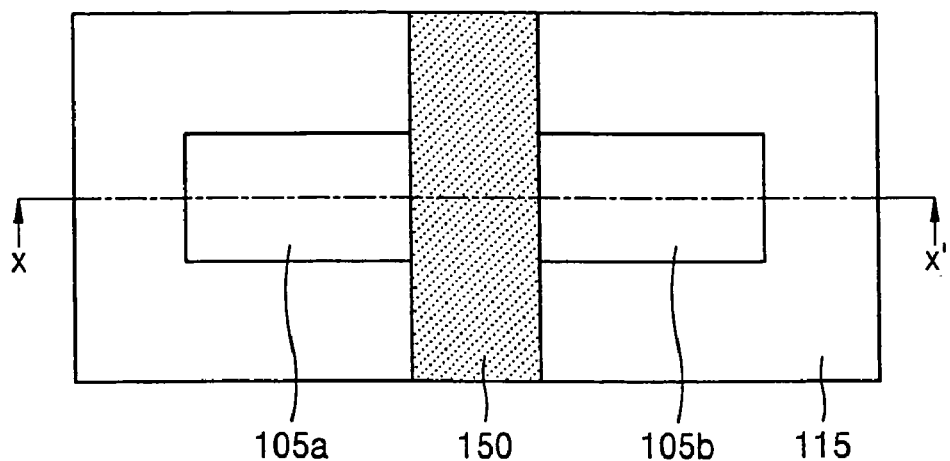
Figure 14:
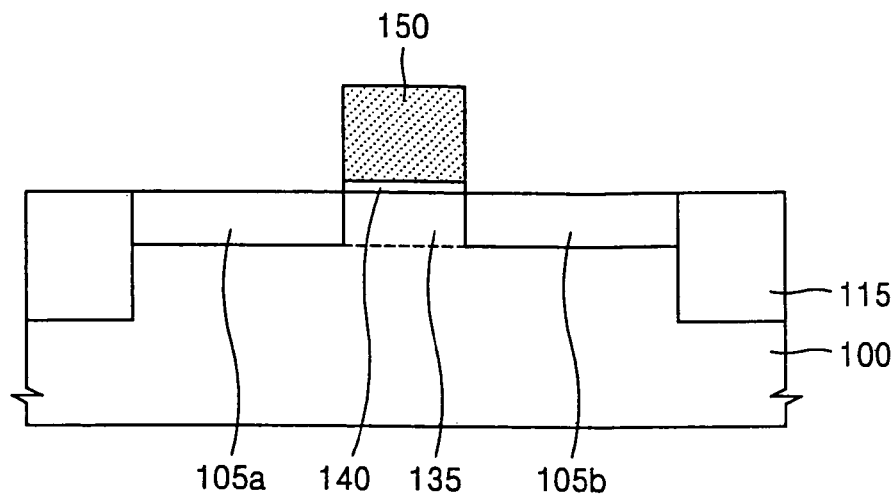

Referring to FIGS. 6 and 14, the conductive layer 145 may be chemical mechanical polished to expose the surface of the hard mask layer 120. Then, the hard mask layer 120 is removed to form the gate electrode 150. At this time, sidewalls of the gate electrode 150 may substantially align with a boundary between the channel layer 135 and the source region 105a, and/or a boundary between the channel layer 135 and drain region 105b, as shown in FIG. 14, for example. A thermal annealing process can be additionally performed so as to adjust an overlap length between the gate electrode 150 and the source and drain regions 105a and 105b.

Figure 7:
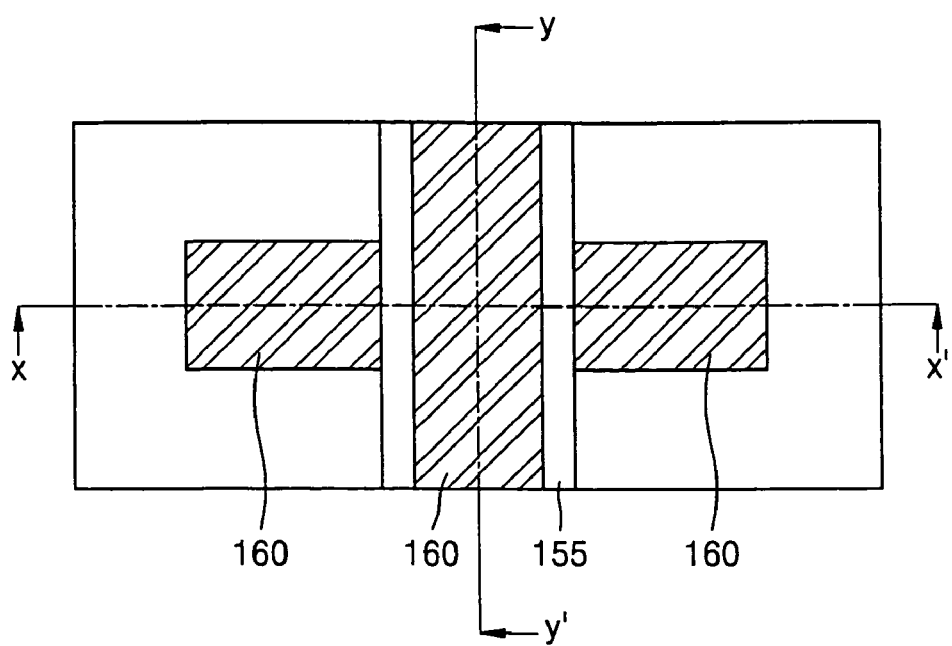
Figure 15A:
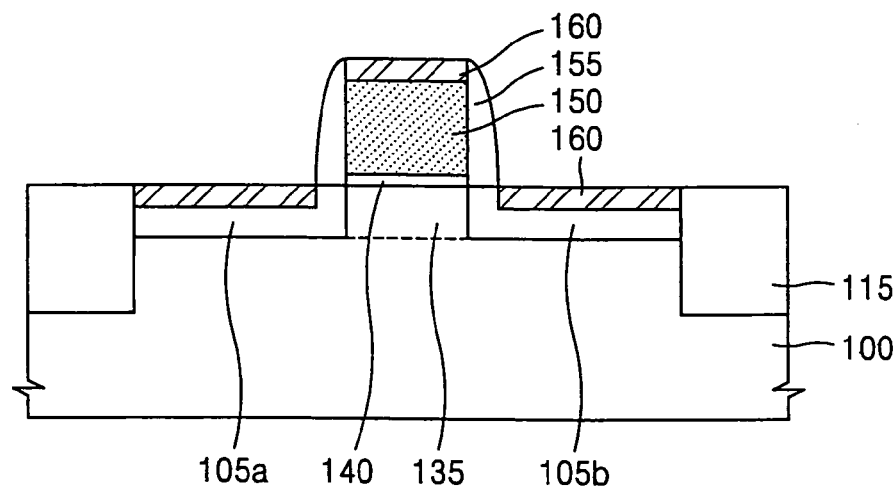
Figure 15B:
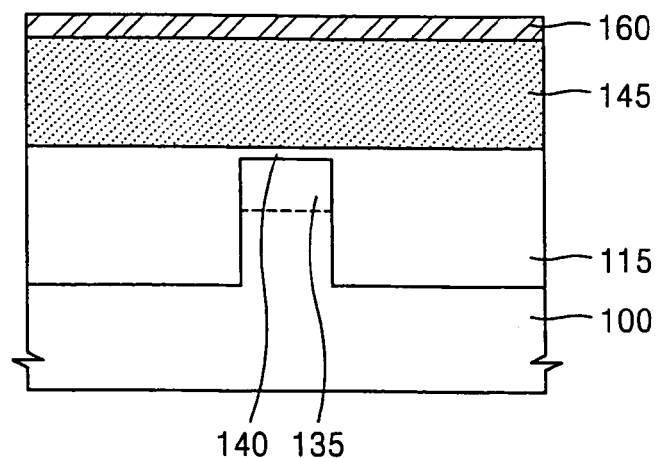

Referring to FIGS. 7, 15A and 15B, corresponding spacers 155 may be formed on corresponding sidewalls of the gate electrode 150 by a known method. A transition metal layer may then be deposited on the resulting structure and a thermal process performed thereon to form a silicide layer 160 on the gate electrode 150, source region 105a and drain region 105b.

Figure 16:
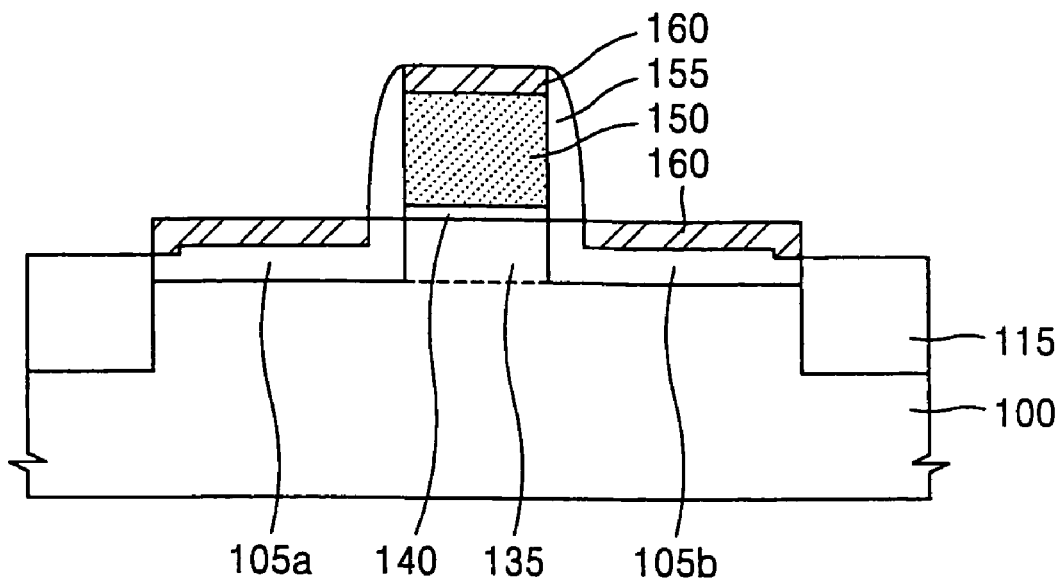
FIGS. 16 through 19 are sectional views illustrating a modification of a transistor according to an exemplary embodiment of the present invention.

Referring to FIG. 16, before the formation of the silicide layer 160, a portion of the isolation film 115 formed at one side the source and drain regions 105a and 105b may be removed to a given depth using a suitable etching process. In FIG. 16, this removed portion of the isolation film 115 may be shown by a notch in the isolation film 115. In an example, the isolation film 115 may be removed by an amount equal to the depth of the source and drain regions 105a and 105b. In this manner, surface area of the silicide layer 160 may be expanded.

Figure 17:
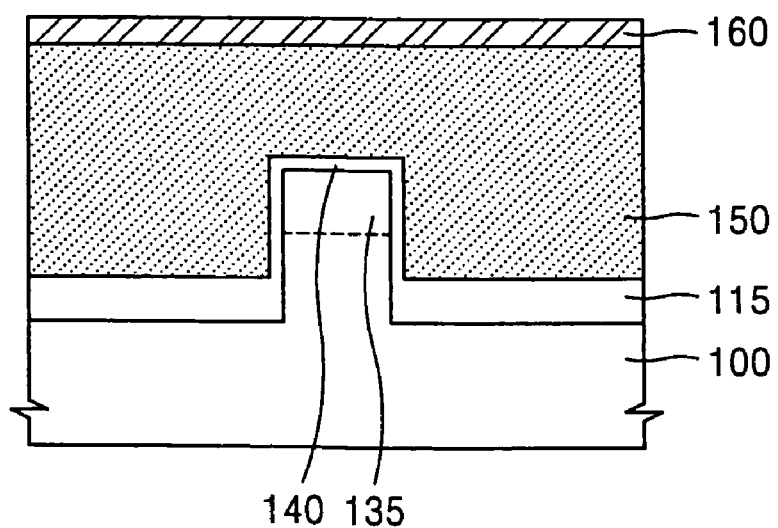

Referring to FIG. 17, after the formation of the channel layer 135, a given portion of the isolation film 115 disposed in a width direction of the channel layer 135 may be removed to a given depth. By doing so, an upper surface of the channel layer 135 and the side surfaces in the width direction of the channel layer 135 may be exposed. A gate oxide layer 140 may be formed on the surface of the exposed channel layer 135, and the gate electrode 150 and the silicide layer 160 may be formed. As shown, the gate electrode 150 may be formed so as to enclose 3-dimensions of the channel layer 135, such that a FinFET (so called because the free-standing sidewall spacers of the formed FET resemble fins) using the 3-dimensions as a channel can be formed. Forming a FET such as a Fin FET as described above may reduce adverse effects of the short channel effect, and may be applied to a next generation semiconductor device, for example.

Figure 18:
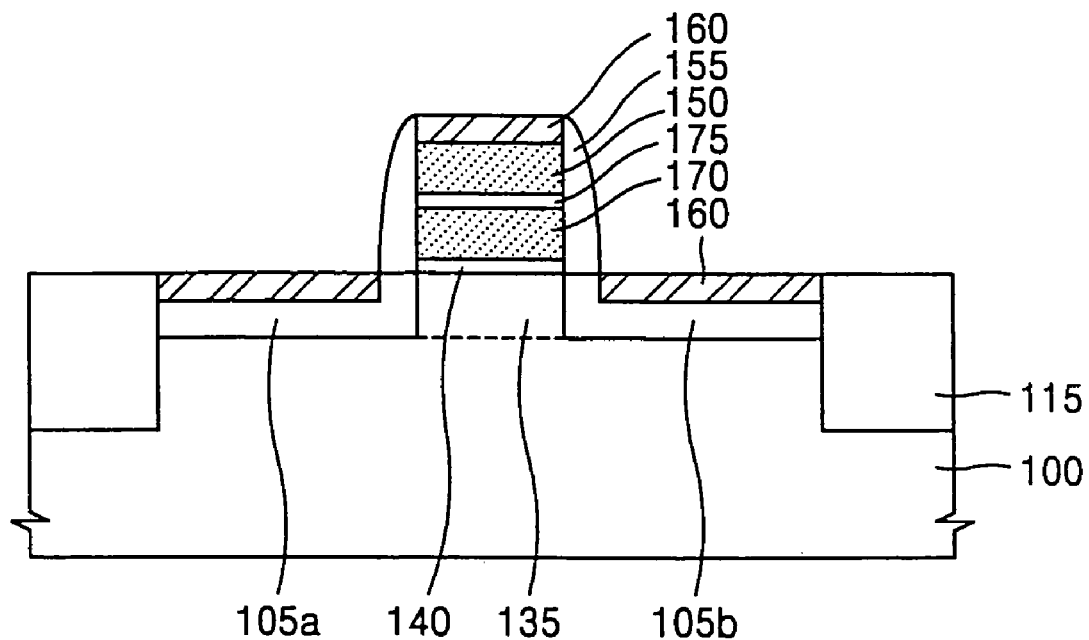

Referring to FIG. 18, a storage node may be formed after the gate oxide layer 140 is formed. The storage node may consist of a floating gate electrode 170 formed of polysilicon layer and an inter gate insulating layer 175 formed of oxide-nitride-oxide (ONO), for example. The storage node may be a charge storage unit, such as a single ONO layer or nano-crystal layer. If the storage node is embodied as a single ONO layer, the gate oxide layer 140 can be omitted. In this manner, a flash memory can be manufactured by forming the storage node on a lower portion of the gate electrode 145. Also as shown in FIG. 18, a flash FinFET can be manufactured by forming the floating gate electrode 170 and the inter gate insulating layer 175 once a portion of the isolation film 115 has been removed to a given depth, for example.

Figure 19:
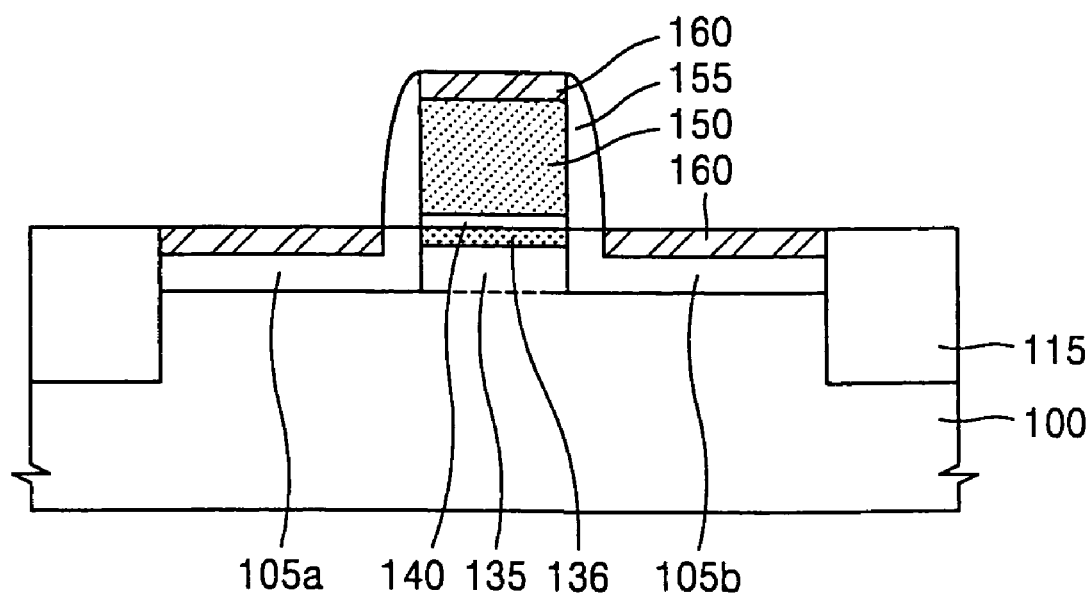

Referring to FIG. 19, a high mobility material 136 may be formed on the surface of the channel layer 135. The high mobility material 136 may be a material layer or stacked structure selected from the group consisting of C, Si, Ge and combinations thereof. Like the channel layer 135, the high mobility material 136 may be formed by a SEG process, for example. Transistor mobility may be improved by forming the high mobility material 136 on the surface of the channel layer 135.

According to the exemplary embodiments of the present invention as described above, the junction layer 105 may be formed of a doped silicon layer on the semiconductor substrate 100. The source and drain regions 105a and 105b may be formed by performing anisotrophic etching on the junction layer 105. A SEG process may be performed to fill a gap or groove 130 between the source and drain regions 105a and 105b, thereby forming the channel layer 135. Boundaries between the channel layer 135 and the source and drain regions 105a and 105b may be perpendicular to the surface of the semiconductor substrate 100, so that the doping profile of the source and drain regions 105a and 105b has a desired, definite abruptness. In this manner, junction abruptness may be improved.

Figure 20:
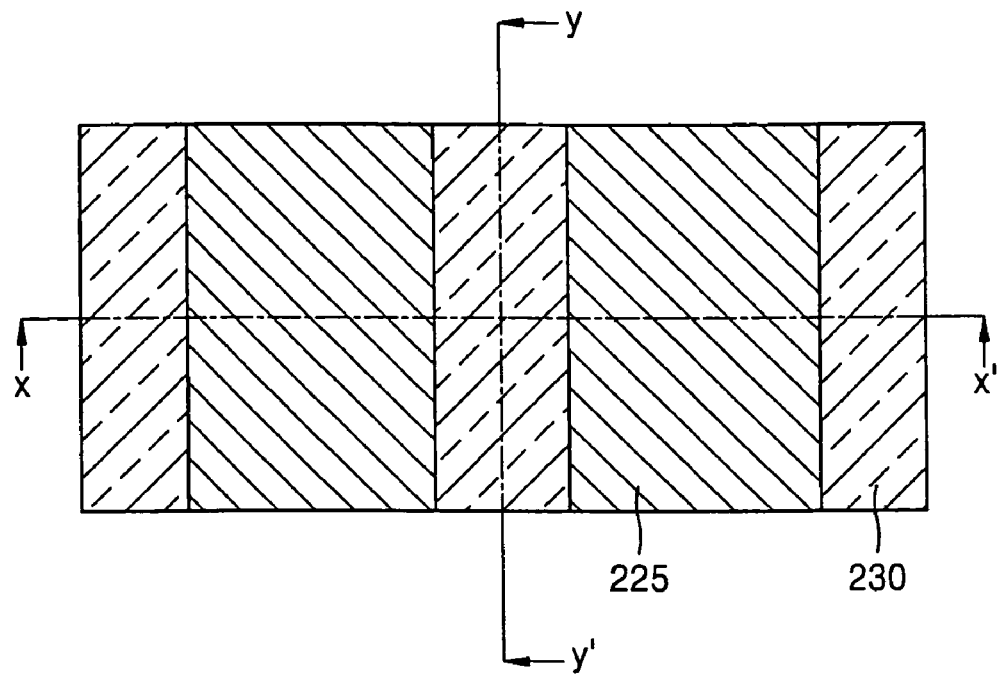
FIGS. 20 through 22 are plan views of a transistor according to another exemplary embodiment of the present invention.
Figure 21:
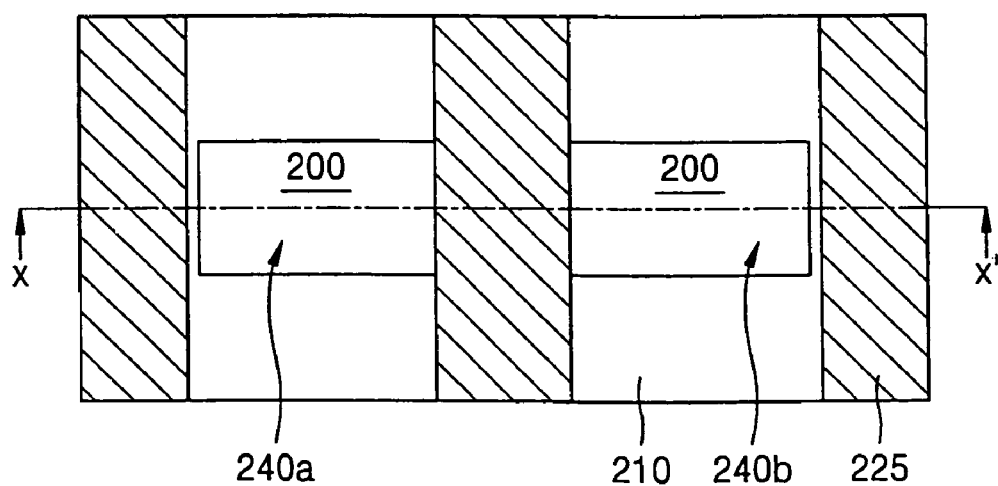
Figure 22:
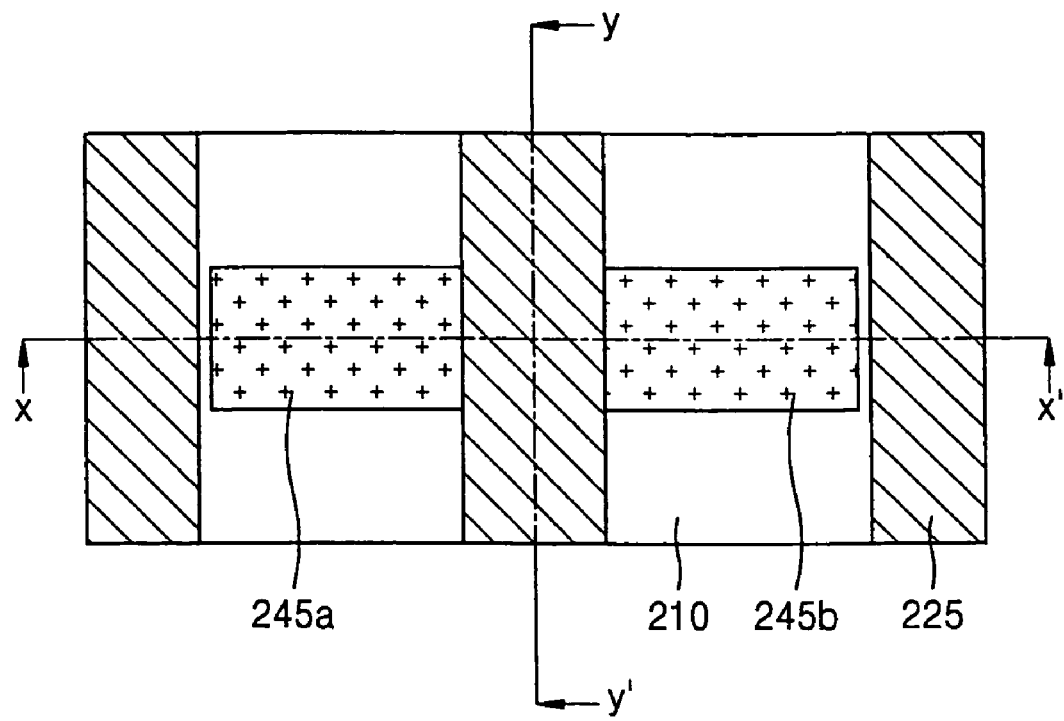
Figure 23A:
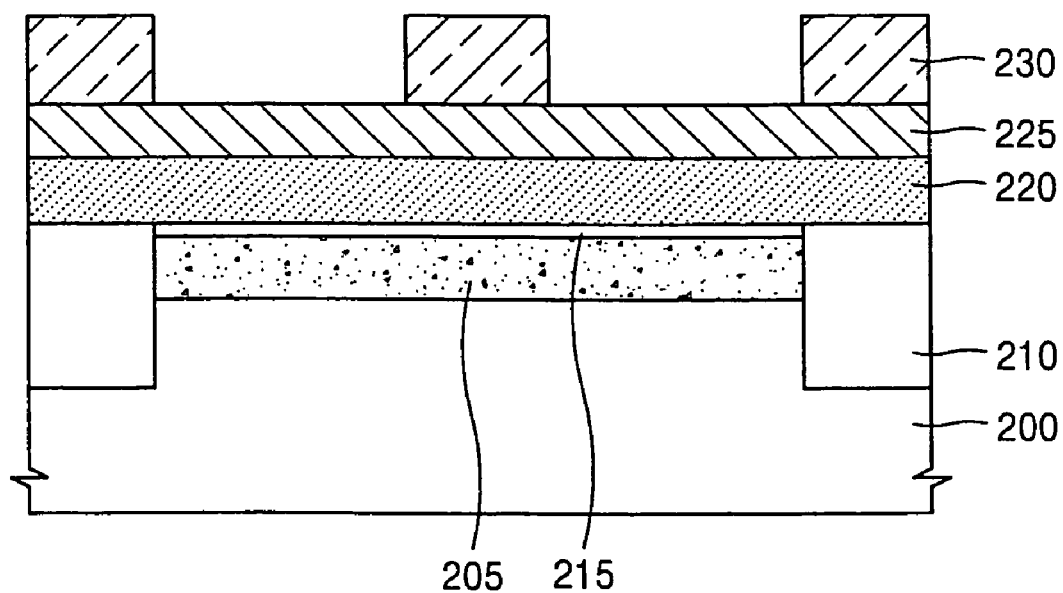
FIGS. 23 through 25 are sectional views of a transistor according to another exemplary embodiment of the present invention.
Figure 23B:
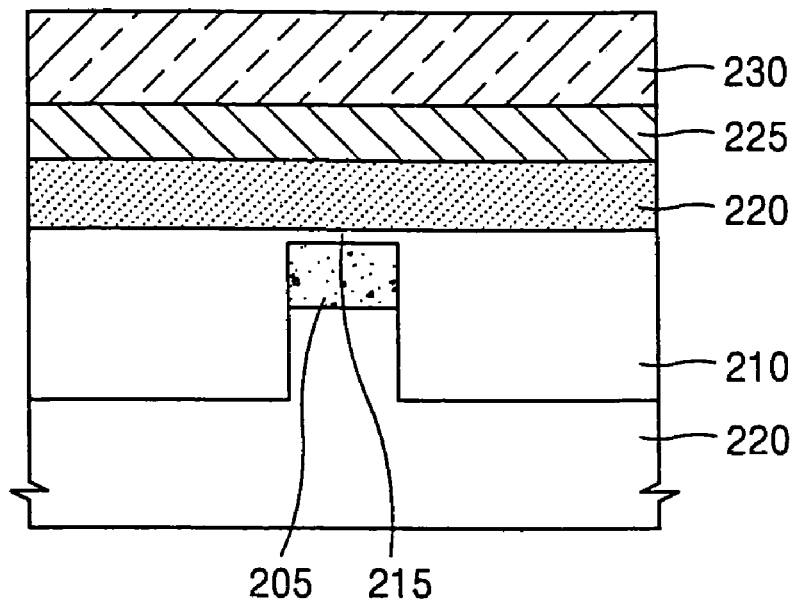
Figure 24:
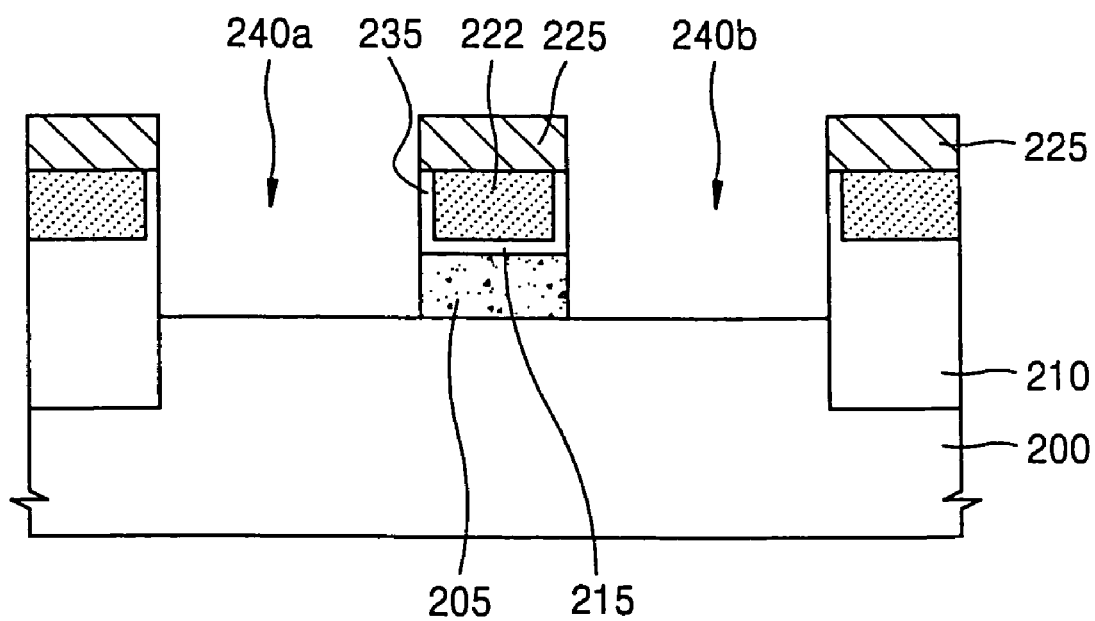
Figure 25A:
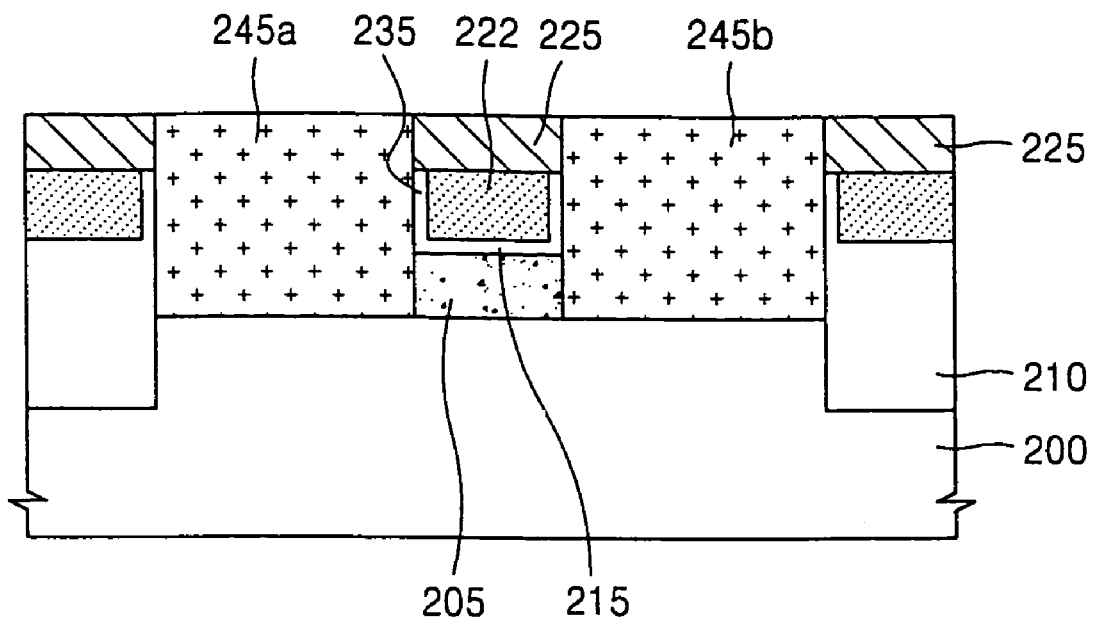
Figure 25B:
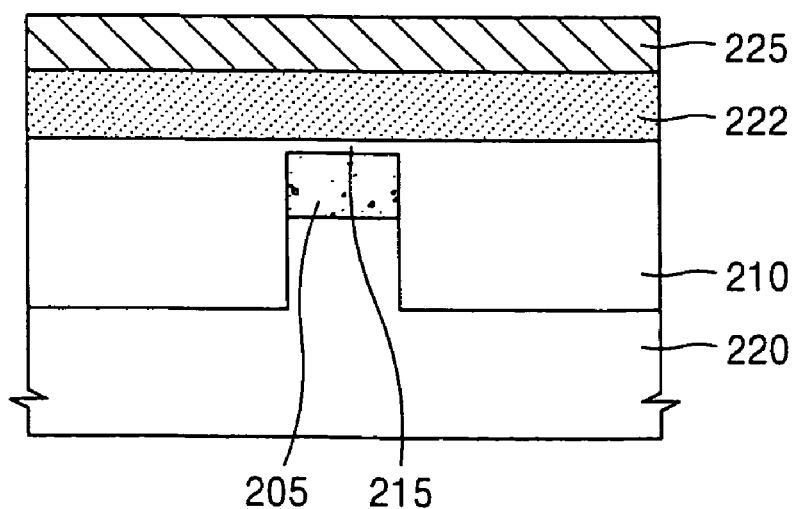

FIGS. 20 through 22 are plan views of a transistor according to another exemplary embodiment of the present invention, and FIGS. 23 through 25 are sectional views of the transistor of FIGS. 20-22. For reference, FIGS. 23A, 24 and 25A are sectional views taken along the lines x-x' of FIGS. 20 through 22, and FIGS. 23B and 25B are sectional views taken along the lines y-y' of FIGS. 20 through 22.

Referring to FIGS. 20, 23A and 23B, a channel layer 205 may be formed on a semiconductor substrate 200. The channel layer 205 may be formed across part of or across the entire surface of the semiconductor substrate 200, and may be a doped silicon layer. An impurity concentration of the channel layer 205 may be that of an implanted threshold voltage control ion of a FET (i.e., ion-implantation process). The channel layer 205 can be formed by implanting impurities into the semiconductor substrate 200 and activating the impurities. Also, the channel layer 205 can be formed by a deposition or a SEG process, for example. If the channel layer 205 is formed by the deposition or SEG process, the impurities may be introduced into the channel layer 205 together with the deposition (growth) at the same time, or may be introduced into the channel layer 205 by an ion-implantation process after the channel layer 205 is formed. In an example, the channel layer 205 may have a thickness suitable for the junction depth of the single channel transistor.

A mask pattern (such as shown in FIG. 1) for an isolation film may be formed on the channel layer 205 to expose a region for an isolation film. The mask pattern for the isolation film may be a silicon nitride layer, for example. A trench may be then formed by etching a given portion of the channel layer 205 and the semiconductor substrate 200 in a shape of the mask pattern. An isolation film 210 may thus be formed by filling the trench with an insulating material. The isolation film 210 may also be formed before the formation of the channel layer 205.

A gate oxide layer 215, gate electrode material 220 and a hard mask layer 225 may be sequentially stacked on the isolation film 210 and the channel layer 205. The gate oxide layer 215 can be formed by a thermal oxidation process. Also, the gate electrode material 220 may be a doped polysilicon layer and the hard mask layer 225 may be a silicon nitride layer. A photoresist pattern 230 may be formed on the hard mask layer 225 so as to define a gate electrode 222.

Referring to FIGS. 21 and 24, the hard mask layer 225 and gate electrode material 220 may be etched using the photoresist pattern 230 as a mask, thereby defining the gate electrode 222. Spacers 235 may then be formed on sidewalls of the gate electrode 222. The spacers 235 may be formed by performing a blanket etching on given thickness. The spacers 235 may be provided for insulation between the gate electrode 222 and source and drain regions (not shown), to be formed later. Gaps or exposed regions 240a and 240b (reserved for the source and drain regions) may be formed by performing an anisotrophic etching on the exposed gate oxide layer 215 and the channel layer 205 using the gate electrode 222 and the spacers 235 as a mask. Since the channel layer 205 is patterned by anisotrophic etching, its sidewalls are perpendicular to the surface of the semiconductor substrate 200.

Referring to FIGS. 22, 25A and 25B, a source region 245a and a drain region 245b may be formed by performing a SEG process on the semiconductor substrate 200 corresponding to the exposed regions 240a and 240b. In an example, the source and drain regions 245a and 245b may be grown in a state that impurities are doped. Then, in some cases, the source and drain regions 245a and 245b may be planarized to expose the surface of the hard mask layer 225. Since the boundaries between the channel layer 205 and the source and drain regions 245a and 245b are perpendicular to the substrate 200 surface, the doping profile of the source and drain regions 245a and 245b has a desired, definite abruptness. Thus, the junction abruptness can be improved. In addition, the source and drain regions 245a and 245b 'rise up' the upper portion of the substrate 200 surface. Therefore, although thickness from a bottom of the gate electrode 222 to a bottom of the source and drain regions 245a and 245b is shallow, a total thickness of the source and drain regions 245a and 245b is actually increased, so that the junction resistance is improved.

Figure 26:
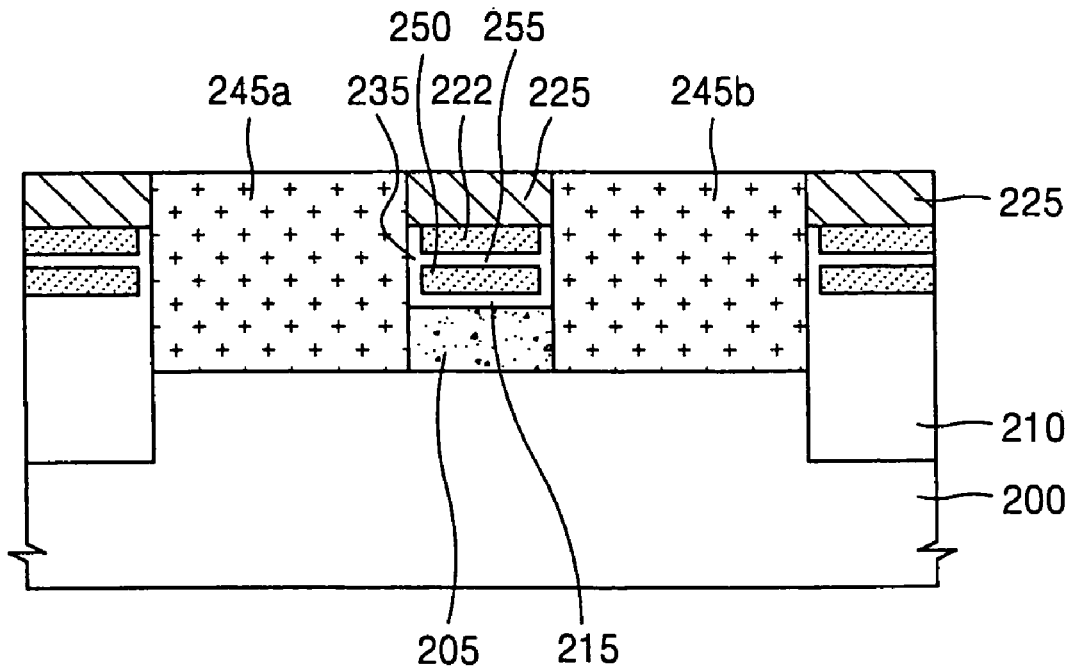
FIGS. 26 and 27 are sectional views illustrating a modification of a transistor according to another exemplary embodiment of the present invention.

Referring to FIG. 26, a storage node may be formed before the formation of the gate electrode 222. The storage node may include a floating gate electrode 250 and an inter gate insulating layer 255, or a single ONO layer or a nano-crystal layer, for example. The floating gate electrode 250 may be a doped polysilicon layer and the inter gate insulating layer 255 may be an ONO layer. If the storage node is a single ONO layer, the gate oxide layer 215 can be omitted. In this manner, a flash memory can be manufactured by forming the storage node on a lower portion of the gate electrode 222.

Figure 27:
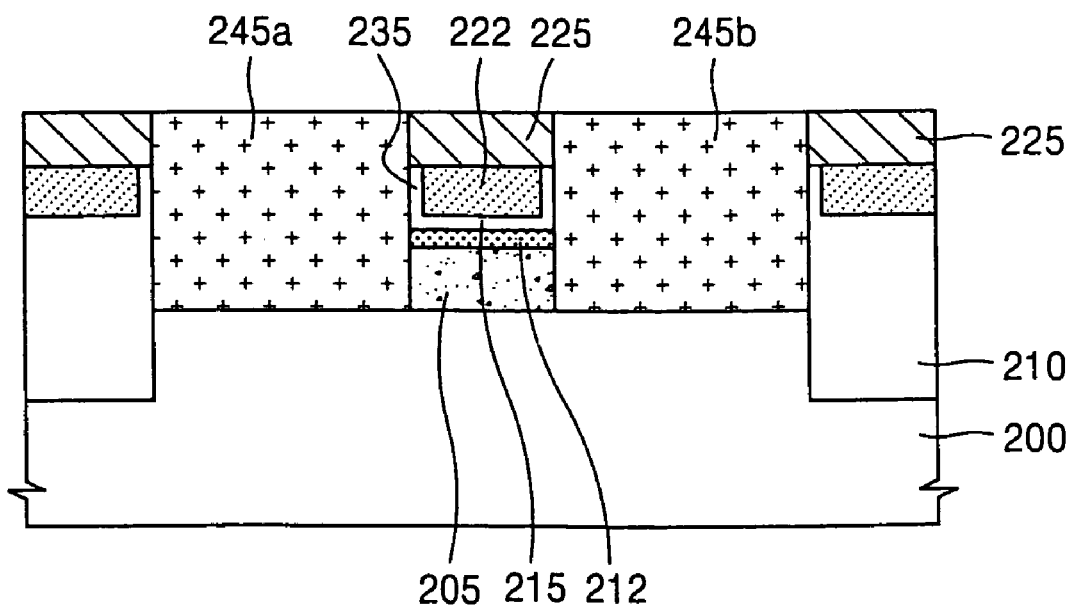

Referring to FIG. 27, a high mobility material 212 may be formed on the surface of the channel layer 205 before the formation of the gate oxide layer 215. The high mobility material 212 may be a material layer or stacked structure selected from the group consisting of C, Si, Ge and combinations thereof. The high mobility material 212 may be formed by a SEG process, for example. Transistor mobility may be improved by forming the high mobility material 212 on the surface of the channel layer 205.

According to the above exemplary embodiment of the present invention, the gate electrode 222 and the channel layer 205 may be defined by the anisotrophic etching, and the source and drain regions 245a and 245b may be formed or built up on both sides of the channel layer 205 by the SEG process. Therefore, the boundaries between the channel layer 205 and the source and drain regions 245a and 245b may be perpendicular to the surface of the semiconductor substrate 200, so that the doping profile of the source and drain regions 245a and 245b has a desired, definite abruptness. In this manner, junction abruptness may thus be improved.

Figure 28:
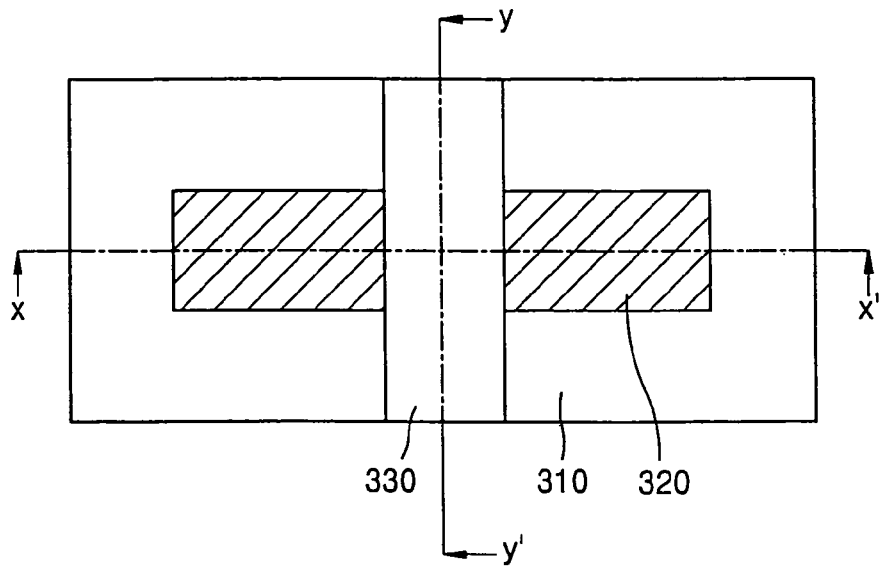
FIGS. 28 through 30 are plan views of a transistor according to a another exemplary embodiment of the present invention.
Figure 29:
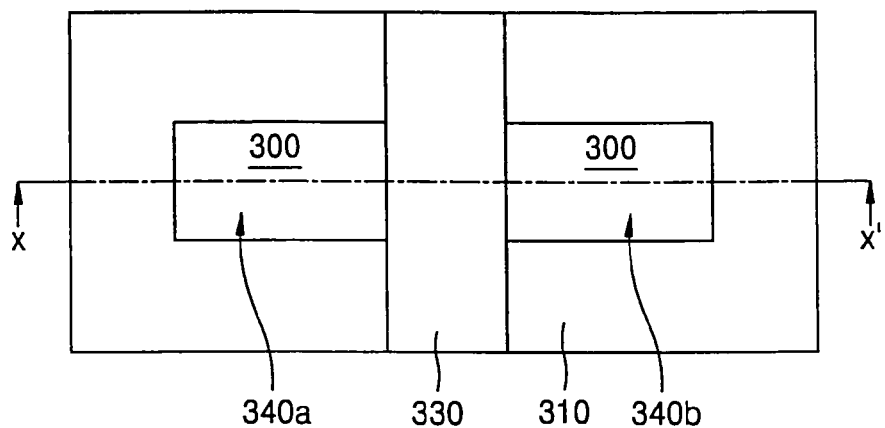
Figure 30:
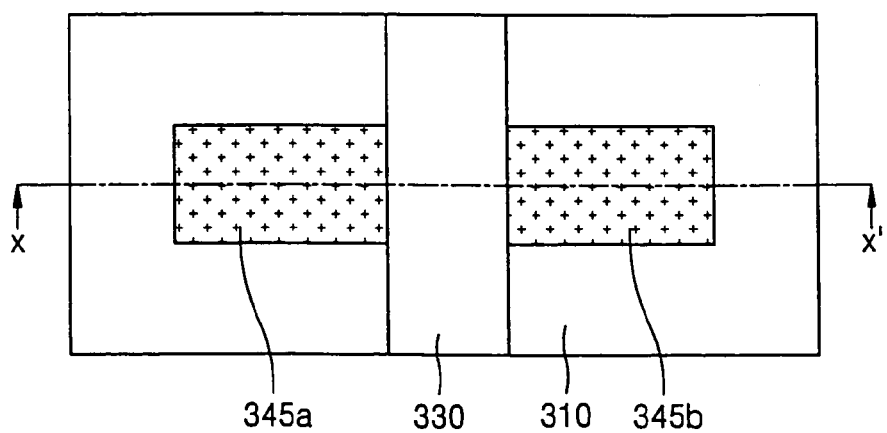
Figure 31A:
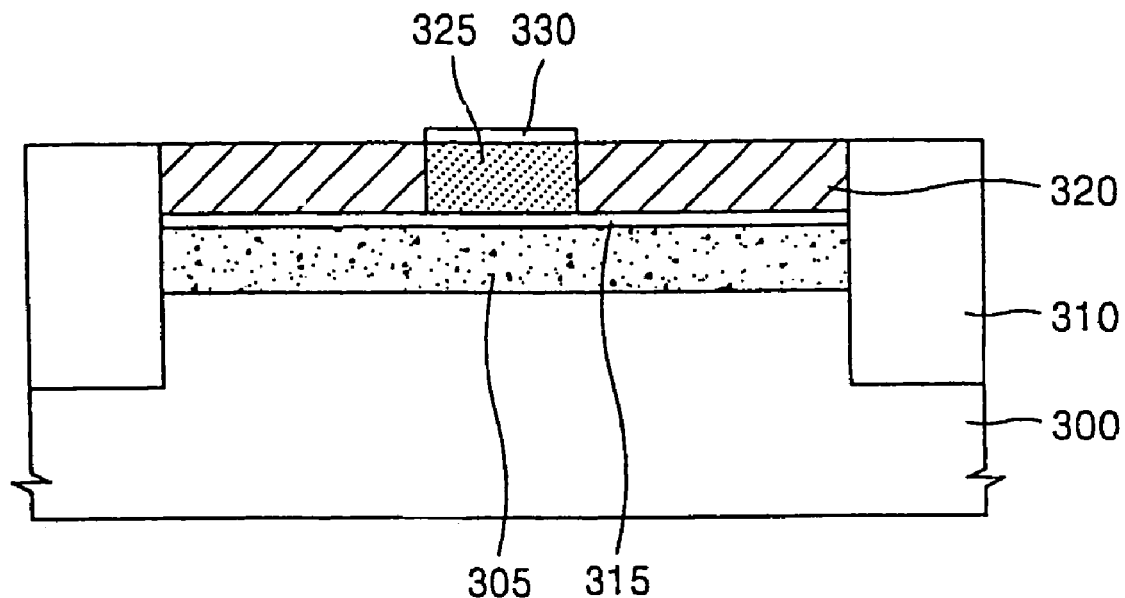
FIGS. 31 through 33 are sectional views of a transistor according to another exemplary embodiment of the present invention.
Figure 31B:
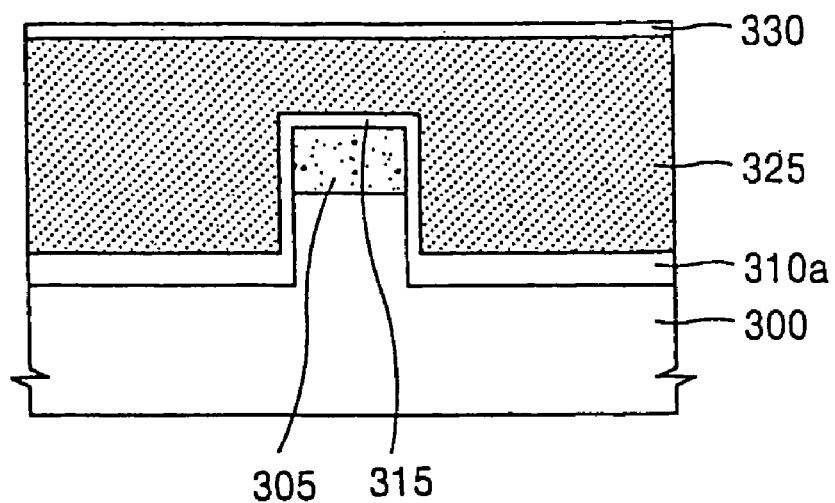
Figure 32:
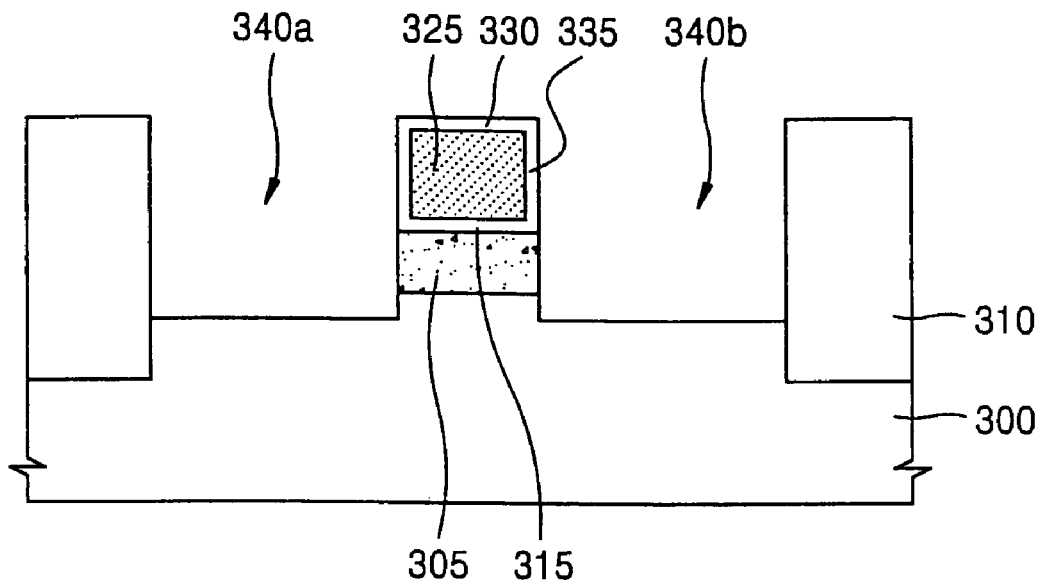
Figure 33:
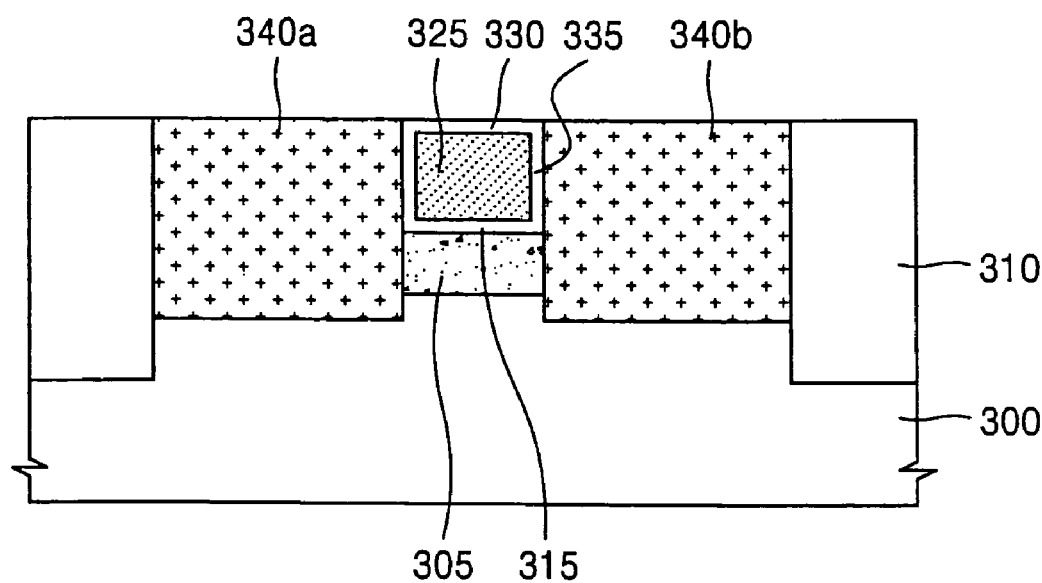

FIGS. 28 through 30 are plan views of a transistor according to another exemplary embodiment of the present invention, and FIGS. 31 through 33 are sectional views of the transistor in FIGS. 28-30. For reference, FIGS. 31A, 32 and 33 are sectional views taken along the lines x-x' of FIGS. 28 through 30, and FIG. 31B is a sectional view taken along the line y-y' of FIG. 28.

Referring to FIGS. 28, 31A and 31B, a channel layer 305 may be formed on a semiconductor substrate 300 by the same method as the above-described embodiments. The channel layer 305 may have a junction region thickness suitable for a short channel transistor, for example. An oxide layer 315 and a silicon nitride layer 320 may be sequentially stacked on the channel layer 305, and given portions of the silicon nitride layer 320 and the oxide layer 315 patterned to expose a region for a device isolation, thereby forming a mask pattern for an isolation film. A trench may be formed by etching given portions of the channel layer 305 and the semiconductor substrate 300 in a shape of the mask pattern. An isolation film 310 may be formed by filling the trench with an insulating material. At this time, the isolation film 310 can be formed before the formation of the channel layer 305.

In order to form a damascene gate electrode, a photoresist pattern (not shown) for opening the region reserved for gate electrode may be formed on the resulting structure. The exposed silicon nitride layer 320 may be etched in a shape of the photoresist pattern (not shown). Also, in order to form a FinFET, the exposed isolation film 310 may be etched. In FIG. 31B, reference numeral 310a represents the recessed isolation film 310. In an example, the surface of the isolation film 310a may be positioned at a bottom of the channel layer 305 so as to expose the sidewalls of the channel layer 305. Then, the photoresist pattern is removed.

A conductive layer for a gate electrode may be deposited on the resulting structure. Then, a damascene gate electrode 325 may be formed by performing a CMP on the conductive layer so as to expose the surface of the silicon nitride layer 320. In order to protect the gate electrode 325, a hard mask layer 330 may be formed by oxidizing the surface of the gate electrode 325.

When the region for the gate electrode is defined, the oxide layer 315 as well as the silicon nitride layer 320 may be removed and then a new gate oxide layer formed before the deposition of the conductive layer for the gate electrode 325.

Referring to FIGS. 29 and 32, the gate electrode 325 may be formed by etching the conductive layer for the gate electrode 325 using the hard mask layer 330 as a mask. Spacers 335 are formed on both sidewalls of the gate electrode 325. The spacers 335 act as an insulating layer and can be formed by performing a blanket etching on an insulating layer to a given thickness or oxidizing the sidewalls of the gate electrode 325 to a given oxide thickness. The spacers 335 are provided for insulation between the gate electrode 325 and source and drain region (not shown), which will be formed later.

An anisotrophic etching may be performed on the exposed gate oxide layer 315 and the channel layer 305 using the gate electrode 325 and the spacers 335 as a mask. In this manner, regions or gaps 340a and 340b, reserved for the source and drain regions, may be formed. Since the channel layer 305 is patterned by the anisotrophic etching, its sidewalls may be perpendicular to the surface of the semiconductor substrate 300.

Referring to FIGS. 30 and 33, source and drain regions 345a and 345b may be formed via a SEG process, for example, on the semiconductor substrate 300 disposed at the exposed gaps or 340a and 340b reserved for the source and drain regions. The source and drain regions 345a and 345b may be formed on side portions disposed in a length direction of the channel layer 305. Also, preferably, the source and drain regions 345a and 345b may be grown in a state that impurities are doped. Then, in some cases, the source and drain regions 345a and 345b may be planarized to expose the surface of the hard mask layer 320.

As described above, since the source and drain regions 345a and 345b are formed so as to rise up from the surface of substrate 300, the junction abruptness may be additionally improved. Similar to as shown in FIGS. 15A and 15B, a silicide layer may also be formed on the source and drain regions 345a and 345b.

Figure 34:
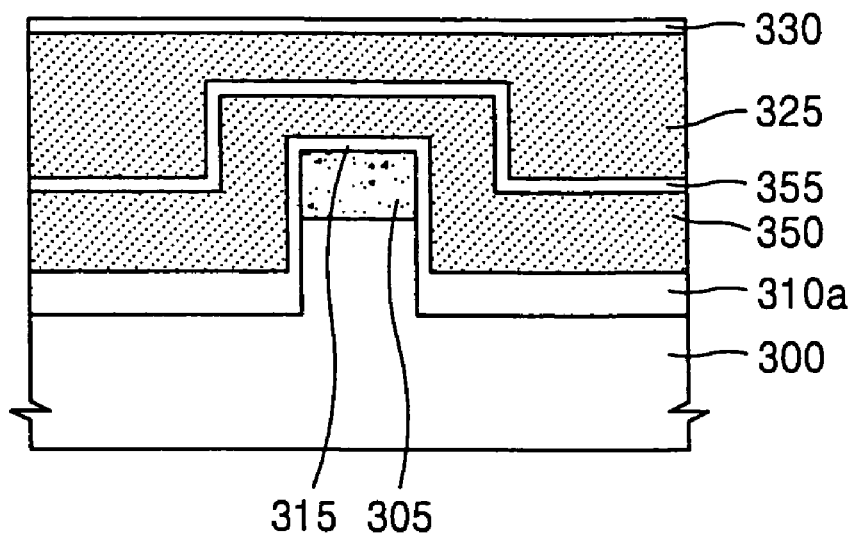
FIGS. 34 and 35 are sectional views illustrating a modification of a transistor according to another exemplary embodiment of the present invention.

Referring to FIG. 34, a storage node can be formed before the gate oxide layer 315 is formed. The storage node may be a stacked structure of a floating gate electrode 350 and an inter gate insulating layer 355, or an ONO layer or a nano-crystal layer. When the storage node is a single ONO layer, the gate oxide layer 315 can be omitted. In this manner, a flash FinFET can be manufactured by forming the storage node on a lower portion of the gate electrode 325.

Figure 35:
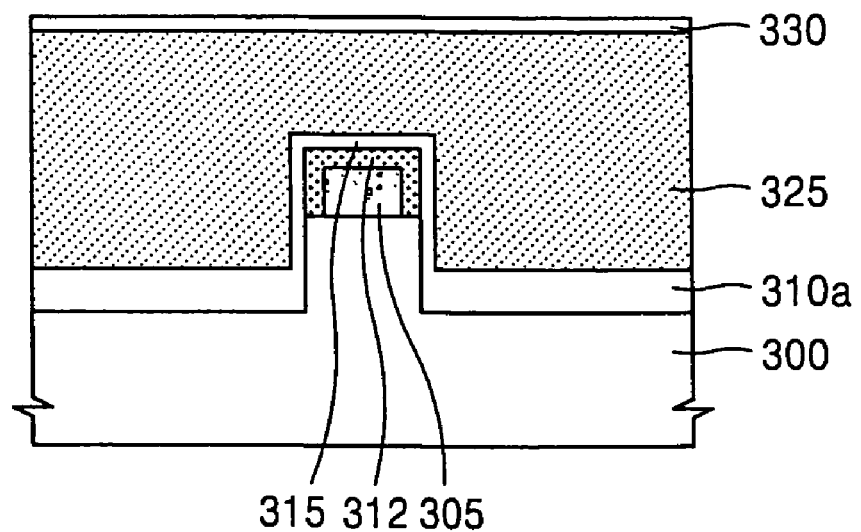

Referring to FIG. 35, a high mobility material 312 may be further formed on the surface of the channel layer 305 before the formation of the gate oxide layer 315. The high mobility material 312 may be a material layer or stacked structure selected from the group consisting of C, Si, Ge and combinations thereof. The high mobility material 312 may be formed by a SEG process, for example. In this manner, a FinFET with an improved mobility can be improved by forming the high mobility material 312 on the surface of the channel layer 305.

According to the above exemplary embodiment of the present invention, since the channel layer 305 is defined by the anisotrophic etching, the boundaries between the channel layer 305 and the source and drain regions 345a and 345b may be perpendicular to the surface of the semiconductor substrate 300, so that the doping profile of the source and drain regions 345a and 345b has a desired, definite abruptness. Thus, the junction abruptness is improved. Also, the transistor according to the exemplary embodiments of the present invention may have a FinFET structure in which the gate electrode 325 and the floating gate electrode 350 is overlapped with the upper and side surfaces of the channel layer 305 to reduce the occurrence of the short channel effect.

As described above, the source and drain regions (and/or the channel region) may be defined by the anisotrophic etching, and the channel region formed between the source and drain regions (and/or the source and drain regions formed on both sides of the channel layer) may be formed by a SEG process. Therefore, boundaries between the channel layer and the source and drain regions may be perpendicular (i.e., perpendicular or substantially perpendicular) to the semiconductor substrate, so that the doping profile of the source and drain regions has a desired abruptness. Thus, the junction abruptness can be improved and the spreading resistance occurring at the boundaries of the junction region can be reduced.

Even when the junction depth of the source and source regions (junction region) is reduced, any increase in the junction resistance may be avoided. Therefore, the single channel effect can be suppressed so that the on current of the transistor can be improved.

The exemplary embodiments of the present invention being thus described, it will be obvious that the same may be varied in many ways. Such variations are not to be regarded as departure from the spirit and scope of the exemplary embodiments of the present invention, and all such modifications as would be obvious to one skilled in the art are intended to be included within the scope of the following claims.

What is claimed is:

1. A method for manufacturing a field effect transistor (FET), comprising:
   forming a channel layer on a semiconductor substrate;
   forming a gate oxide layer on the channel layer;
   forming a gate electrode material on the gate oxide layer;
   forming a mask layer on the gate electrode material;
   patterning the gate electrode material using the mask layer to form a gate electrode;
   forming a spacer on each corresponding sidewall of the gate electrode;
   exposing the semiconductor substrate by etching the gate oxide layer and the channel layer, using the gate electrode and the spacers as a mask for defining regions reserved for a source region and a drain region in the channel layer; and
   forming an impurity-containing epitaxial layer in the defined regions to form the source and drain regions.

2. The method of claim 1, wherein forming the channel layer includes:
   implanting impurities into a surface of the semiconductor substrate; and
   activating the impurities.

3. The method of claim 1, wherein forming the channel layer includes:
   growing an epitaxial layer on a surface of the semiconductor substrate; and
   doping impurities into the epitaxial layer.

4. The method of claim 1, wherein forming of channel layer includes growing an epitaxial layer with doped impurities therein on a surface of the semiconductor substrate.

5. The method of claim 1, wherein forming the channel layer includes depositing a silicon layer having doped impurities therein on a surface of the semiconductor substrate.

6. The method of claim 1, wherein forming the spacers includes oxidizing sidewalls of the gate electrode to a given oxide thickness.

7. The method of claim 1, wherein forming the source and drain regions includes performing a selective epitaxial growth (SEG) process on the exposed semiconductor substrate to grow the source and drain regions to a given height.

8. The method of claim 1, further comprising:
   forming a high mobility material on the channel layer after forming the channel but before forming the gate electrode.

9. The method of claim 8, wherein the high mobility material is a layer or stacked structure selected from the group consisting of C, Si, Ge and combinations thereof.

10. The method of claim 8, wherein forming the high mobility material includes forming the high mobility material by an epitaxial growth process.

11. The method of claim 1, further comprising:
    forming a gate oxide layer after forming the channel layer but before forming the gate electrode.

12. The method of claim 1, further comprising:
    forming a storage node after forming the channel layer but before forming the gate electrode.

13. The method of claim 1, further comprising:
    forming an isolation film on a given portion of the semiconductor substrate after forming the channel layer but before forming the gate electrode,
    wherein forming the isolation film and forming the gate electrode further includes:
    forming a mask pattern on the channel layer so as to expose a device isolation region;
    forming the isolation film on the exposed device isolation region;
    forming a resist pattern on the mask pattern so as to expose a space reserved for the gate electrode;
    etching the mask pattern and isolation film to a given depth in a shape of the resist pattern;
    removing the resist pattern;
    depositing a gate electrode material in the exposed space;
    planarizing the gate electrode material to expose a surface of the mask pattern, so as to realize the gate electrode; and
    removing the mask pattern.

14. The method of claim 13, wherein the isolation film is etched to expose side portions of the channel layer.

15. The method of claim 7, wherein the source and drain regions are grown higher than an upper surface of the channel.

* * * * *